United States Patent [19]
Bertin et al.

[11] Patent Number: 5,648,684
[45] Date of Patent: Jul. 15, 1997

[54] ENDCAP CHIP WITH CONDUCTIVE, MONOLITHIC L-CONNECT FOR MULTICHIP STACK

[75] Inventors: Claude Louis Bertin, South Burlington; Wayne John Howell, Williston; Howard Leo Kalter, Colchester, all of Vt.

[73] Assignee: International Business Machines Corporation, Armonk, N.Y.

[21] Appl. No.: 506,939

[22] Filed: Jul. 26, 1995

[51] Int. Cl.⁶ .................................................. H01L 23/02
[52] U.S. Cl. ........................ 257/685; 257/686; 257/723; 257/777
[58] Field of Search ........................ 257/685, 686, 257/723, 777

[56] References Cited

U.S. PATENT DOCUMENTS

| | | | |
|---|---|---|---|
| 3,029,495 | 4/1962 | Doctor | 29/155.5 |
| 3,748,479 | 7/1973 | Lehovec | 250/208 |
| 4,525,921 | 7/1985 | Carson et al. | 29/577 |
| 4,551,629 | 11/1985 | Carson et al. | 250/578 |
| 4,638,348 | 1/1987 | Brown et al. | 357/74 |
| 4,706,166 | 11/1987 | Go | 361/403 |
| 4,707,218 | 11/1987 | Giammarco et al. | 156/643 |
| 4,727,410 | 2/1988 | Higgins, III | 357/74 |
| 4,764,846 | 8/1988 | Go | 361/388 |
| 4,794,092 | 12/1988 | Solomon | 437/51 |
| 4,801,992 | 1/1989 | Golubic | 357/40 |
| 4,862,249 | 8/1989 | Carlson | 357/80 |
| 4,894,706 | 1/1990 | Sato et al. | 357/72 |
| 4,901,136 | 2/1990 | Neugebauer et al. | 357/75 |
| 4,925,808 | 5/1990 | Richardson | 437/62 |
| 4,930,216 | 6/1990 | Nelson | 29/854 |
| 4,956,694 | 9/1990 | Eide | 257/723 |
| 4,983,533 | 1/1991 | Go | 437/7 |
| 4,990,462 | 2/1991 | Sliwa, Jr. | 437/51 |
| 5,019,946 | 5/1991 | Eichelberger et al. | 361/414 |
| 5,051,865 | 9/1991 | Kato | 361/386 |
| 5,075,253 | 12/1991 | Sliwa, Jr. | 437/209 |
| 5,104,820 | 4/1992 | Go et al. | 437/51 |
| 5,122,481 | 6/1992 | Nishiguchi | 437/225 |
| 5,162,251 | 11/1992 | Poole et al. | 437/53 |
| 5,266,833 | 11/1993 | Capps | 257/690 |
| 5,270,261 | 12/1993 | Bertin et al. | 437/209 |
| 5,293,061 | 3/1994 | Hosaka | 257/622 |
| 5,313,096 | 5/1994 | Eide | 257/686 |

FOREIGN PATENT DOCUMENTS

| | | |
|---|---|---|
| 0317084A2 | of 1989 | European Pat. Off. . |
| 2645681 | of 1990 | France . |
| 59-205747 | of 1984 | Japan . |
| 61-35547 | of 1986 | Japan . |
| 2-207562 | of 1990 | Japan . |
| 2-17644 | of 1990 | Japan . |
| WO89/04113 | of 1989 | WIPO . |

OTHER PUBLICATIONS

Stoller, H. I., "Edge-Mounted Chip Assembly For Microprocessors," IBM Tech. Disclosure Bulletin, vol. 23, No. 2, pp. 581–582, Jul. 1980.

"Process for Producing Lateral Chip Connectors," IBM Tech. Disclosure Bulletin, vol. 32, No. 3B, pp. 410–411, Aug. 1989.

Carson, John C., "Unconventional Focal-Plane Architecture (FPA)," SPIE, vol. 223 IR Image Sensor Technology, 1980.

*Primary Examiner*—Sara W. Crane
*Assistant Examiner*—Roy Potter
*Attorney, Agent, or Firm*—Heslin & Rothenberg, P.C.

[57] ABSTRACT

An endcap chip is provided for a multichip stack comprising multiple integrated circuit chips laminated together. The endcap chip has a substrate with an upper surface and a edge surface, which extends in a plane orthogonal to the upper surface. At least one conductive, monolithic L-connect is disposed over the substrate such that a first leg extends at least partially over the upper surface of the substrate and a second leg extends at least partially over the edge surface of the substrate. When the endcap chip is located at the end of the multichip stack, the at least one conductive, monolithic L-connect electrically connects metal on an end face of the stack to metal on a side face of the stack. A fabrication process is set forth for producing the endcap chip with lithographically defined dimensions.

20 Claims, 8 Drawing Sheets fig. 3 fig. 4 fig. 7 fig. 8 fig. 9 fig. 12

ENDCAP CHIP WITH CONDUCTIVE, MONOLITHIC L-CONNECT FOR MULTICHIP STACK

CROSS-REFERENCE TO RELATED APPLICATION

This application contains subject matter which is related to the subject matter of a co-pending U.S. patent application entitled "Methods for Precise Definition of Integrated Circuit Chip Edges," Ser. No. 08/507,186, filed on even date herewith and assigned to the same Assignee, the entirety of which is hereby incorporated herein by reference.

TECHNICAL FIELD

The present invention relates in general to high density electronic packaging which seeks to optimize the number of circuit elements to be included in a given volume and, more particularly, to an endcap chip having a novel monolithic L-connect for electrically interconnecting a metallization on a side face of a multichip stack and a separate metallization on an end face of the multichip stack, and to fabrication methods for producing such a monolithic L-connect and endcap chip.

BACKGROUND ART

Electronic packages composed of multiple laminated integrated circuit chips, or layers containing integrated circuitry, offer significantly decreased volume and improved signal propagation speed. A metallization pattern is often provided directly on one (or more) side face of such a multichip package for integrated circuit interconnections and for electrical connection of integrated circuits to circuitry external to the module. The stack metallization pattern can include both individual contacts and bussed contacts. A multichip module comprising a stack of integrated circuit chips is referred to herein as a "multichip stack."

Recently, a multichip stack has been presented having electrical connect on an end face thereof, see commonly assigned U.S. Pat. No. 5,426,566, entitled "Multichip Integrated Circuit Packages and Systems," which is hereby incorporated herein by reference. This document describes side face and end face metallizations which allow multiple stacks of integrated circuit chips to be directly electrically interconnected. One feature of the structures disclosed is the use of active integrated circuit chips at one or both ends of the multichip stacks. Traditionally, the end chips in a multichip stack comprise ceramic or "dummy" chips provided to facilitate the creation of conventional "T-connects" over wire outs to one or more side face of the stack from the penultimate chips.

Disclosed in the designated patent document is the use of a relatively thick layer of dielectric material, such as polyimide, over active integrated circuit chips disposed at the ends of the multichip stack. This dielectric layer, which has a thickness less than that of a conventional ceramic chip, includes a metal patterned to electrically couple metal on the end face of the stack to metal on a selected side face(s) of the stack. Electrical connection at the side face is attained via a special modified "T-connect," which comprises a modified pad deposited on the side face to electrically connect to an exposed wire out.

Notwithstanding the viability of the above-summarized structure, presented herein is an alternative technique to producing a practical endcap for a multichip stack having a minimized thickness. As briefly noted, the most common endcap technology employed with multichip stacks today consists of a multi-layer ceramic substrate with thick-film internal wiring, typically tungsten. In order to minimize thermal expansion problems with a silicon-based multichip stack, an AlN ceramic is used. Unfortunately, there are several limitations inherent in this technology.

Because AlN ceramic is relatively brittle, the ceramic endcap can only be thinned to approximately 375 micrometers ($\mu$m). Increased thinning can result in unacceptably high yield loss due to cracking and breakage. However, for many applications, especially plastic encapsulated stacks, stack height is critical, with a strong need to make the total multichip stack as thin as possible. Therefore, limiting the thickness of an endcap chip to 375 $\mu$m can be an undesirable restriction. Further, a ceramic endcap requires the use of thick-film wiring ground rules, which are much larger than the thin-film wiring ground rules employed with semiconductor devices. Thus, the use of a ceramic endcap with thick film wiring unnecessarily limits the wiring density achievable on the endcap chip, and therefore, the input/output (I/O) density of the entire multichip stack.

Additionally, the use of dissimilar metals, for example, tungsten for the endcap wiring and a titanium/aluminum or titanium/aluminum-copper alloy for stack side face wiring, can create severe problems where the two metals electrically and physically interface. In addition to the problems associated with interconnection of two dissimilar metals, there can be restrictions on processing environment and chemical exposure resulting from the use of two different metals. For example, an acceptable process chemical exposure for one metal might be unacceptable for the other metal.

Another problem area relates to the formation of the ceramic endcaps. Currently, a ceramic endcap is diced from a larger laminate using mechanical dicing techniques. Unfortunately, mechanical dicing techniques result in endcap size variations, with typical tolerances being +/−5 $\mu$m. Such size variation often means increased stack side face polishing to expose transfer metallurgy leads, which adds cost to the stack fabrication process. Further, in order to minimize ceramic endcap edge defects, which can create significant problems when attempting to process the side face(s) of a stack, the dicing rate of the laminate is significantly reduced. Currently, ceramic endcaps might be diced at 1/10th the standard dicing rate. Such a restriction severely limits manufacturing throughput, and increases inspection requirements and time of manufacture, which ultimately increases stack fabrication costs.

This disclosure is directed towards solutions to the above-noted drawbacks and restrictions of existing stack fabrication technology and significantly improves upon the state of the multichip packaging art.

DISCLOSURE OF INVENTION

Briefly, the invention comprises in one aspect an endcap chip for a multichip stack including multiple integrated circuit chips, each having at least one principal surface laminated to a principal surface of an adjacent integrated circuit chip in the multichip stack. The endcap chip comprises a substrate having an upper surface and an edge surface. The edge surface extends in a plane substantially orthogonal to a plane containing the upper surface such that the edge surface and the upper surface form a right angle. A conductive, monolithic L-connect is provided having a first leg that extends at least partially over the upper surface of the substrate and a second leg that extends at least partially over the edge surface of the substrate. When the endcap chip is employed within the multichip stack, the conductive, monolithic L-connect electrically interconnects metal on an end face of the multichip stack and metal on a side face of the multichip stack, the side face being parallel to the edge surface of the endcap chip's substrate.

In another aspect, a multichip stack is provided comprising a plurality of integrated circuit chips laminated together such that at least one principal surface of each integrated circuit chip is laminated to a principal surface of an adjacent integrated circuit chip. The stack includes an endcap chip having a first principal surface, a second principal surface, and an edge surface. The first principal surface and the second principal surface are parallel and the edge surface resides in a plane substantially orthogonal to the two principal surfaces. The second principal surface is laminated to a principal surface of an adjacent integrated circuit chip of the plurality of integrated circuit chips. The endcap chip further includes a conductive, monolithic L-connect having a first leg extending at least partially over the first principal surface and a second leg extending at least partially over the edge surface. A first metallization is disposed on a stack side face defined by the plurality of integrated circuit chips and the endcap chip. Further, a second metallization is disposed over the stack end face comprising the first principal surface of the endcap chip. The endcap chip is disposed such that the conductive, monolithic L-connect electrically connects the first metallization on the side face and the second metallization on the end face of the multichip stack.

In a further aspect, the invention comprises a method for forming an endcap chip for use in a multichip stack. The method includes: providing a wafer comprising a substrate having an upper surface and a lower surface; forming a trench in the wafer disposed to define in the substrate a substrate edge; forming a conductive, monolithic L-connect having a first leg extending at least partially over the upper surface of the substrate and a second leg extending at least partially over the substrate edge; and separating the endcap from the wafer at least partially along the trench such that the endcap chip includes the conductive, monolithic L-connect, the second leg of the conductive, monolithic L-connect residing at an edge surface of the endcap chip. When the endcap chip is employed within the multichip stack, the conductive, monolithic L-connect electrically interconnects end face metal and side face metal, the side face metal being disposed on a stack side face parallel to the edge surface of the endcap chip.

To summarize, provided herein is a replacement endcap chip technology which enables the production of thinner endcap chips of extremely uniform size. Preferably, the endcap chips are lithographically defined. Further, the endcap chips are fabricated of silicon, thereby eliminating any thermal expansion mismatch with the semiconductor chips in the multichip stack, and the associated reliability issues. If desired, the endcap chips may include regions of active integrated circuitry. In addition, identical metals may be used for both the endcap chip wiring and for the side face wiring on one or more side surfaces of the multichip stack, thereby eliminating any problems inherent in interfacing two dissimilar metals. Using the techniques presented, increased multichip stack fabrication throughput and yield are attained, to ultimately decrease fabrication costs.

BRIEF DESCRIPTION OF THE DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Presented below are various structures and fabrication techniques for producing a precisely defined endcap chip having conductive, monolithic L-connects disposed to electrically connect an end face metallization to a side face metallization on a multichip stack within which the endcap chip is incorporated. Fabrication of the endcap chip preferably proceeds pursuant to the techniques disclosed in commonly assigned, co-pending U.S. patent application entitled "Methods for Precise Definition of Integrated Circuit Chip Edges."

Briefly described, the techniques presented in this incorporated document produce integrated circuit (IC) chips formed with precisely defined edges and sizing. At the wafer processing level, trenches are lithographically etched in the kerf regions of the chips to define within the wafer the edges of the IC chips. The trenches are filled with insulating material, and upper level wiring and metallization is completed for the IC chips. Further trenches are defined down to the filled, previously formed trenches. The wafer is thinned from a lower surface up to the filled trenches, afterwhich the insulating material disposed within the trenches is removed, thereby separating the individual IC chips from the wafer. The precision of IC chip definition facilitates forming a multichip stack since conventional stack level alignment processes become unnecessary. These concepts are applied herein to the fabrication of endcap chips.

Structure and fabrication of the present invention are next described with reference to FIGS. 1–6. Note that with respect to all drawings, the same or similar reference numbers are used throughout multiple figures to designate the same or similar elements. Further, to facilitate understanding the figures are not drawn to scale.

Figure 1:
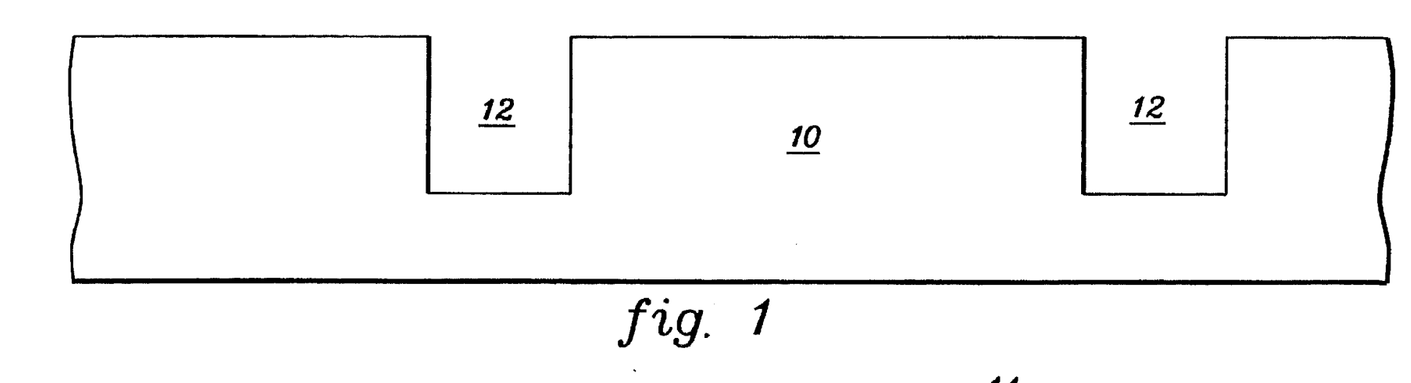
FIG. 1 is a partial cross-sectional view of a wafer section after the formation of trenches therein.
Figure 2:
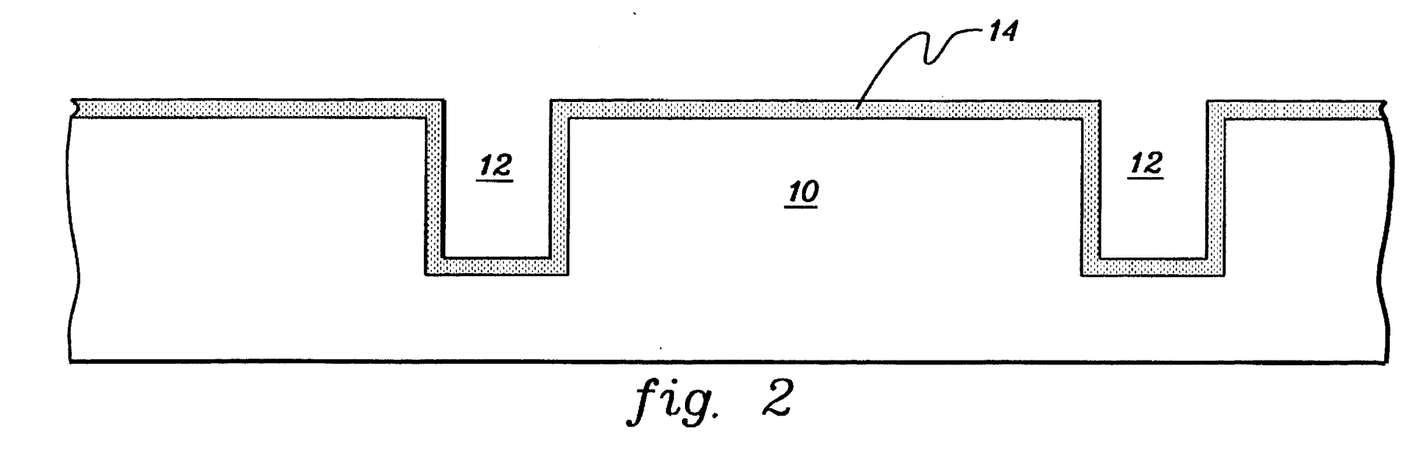
FIG. 2 is a cross-sectional view of the wafer section of FIG. 1 subsequent to formation of a blanket passivation layer.
Figure 3:
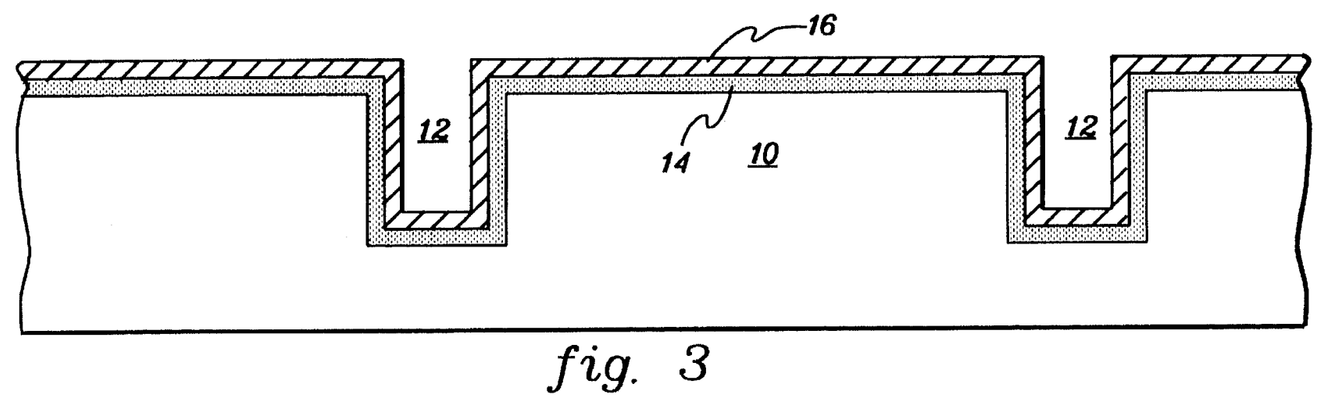
FIG. 3 is a cross-sectional view of the wafer section of FIG. 2 subsequent to formation of a conformal metal layer.
Figure 4:
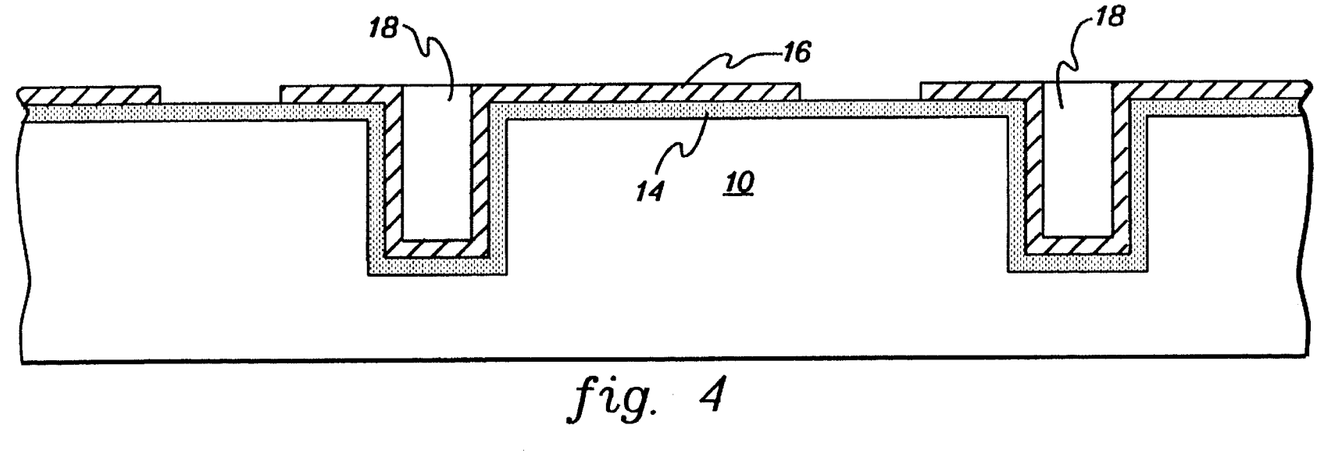
FIG. 4 is a cross-sectional view of the wafer section of FIG. 3 subsequent to patterning of the metal layer and filling of the trenches with a removable material.

In FIG. 1, a wafer 10, such as a silicon wafer, is shown to have trenches 12 etched therein. Preferably, trenches 12 have been lithographically defined, for example, photolithographically etched in the wafer at desired locations within the kerf regions. As one process example, a dry etch may be used to create the trenches. This may comprise a photolithography step to define a mask and a subsequent reactive ion etch ("RIE") process to form the trenches. The trenches should extend to a depth close to the desired thickness of the endcap chip undergoing fabrication. For example, if the endcap chip is to be approximately 100 micrometers, then trenches 12 should be at least 100 micrometers deep. The width of the trenches can vary, but should be sufficient to accommodate the conformal layers discussed below and remain within the defined kerf regions.

Although not shown, one skilled in the art can envision a first set of parallel trenches and a second set of parallel trenches disposed in the wafer such that the parallel trenches in the second set are orthogonal to the parallel trenches in the first set, thereby forming a grid. Using such a grid, multiple rectangular "chips" can be defined as described herein below. Although in this example trenches 12 would form a grid to surround all four edges of an endcap chip defined in the wafer, this is not required. For example, if metallization is employed only on one side face of the resultant multichip stack, then a trench on a single side of the endcap chip could be etched, with the other edges of the chip ultimately defined by mechanically dicing the chip from the wafer. Similarly, if metallization is desired on two or three side faces of the multichip stack, then trenches on two or three edges, respectively, of the endcap chip would be etched within the wafer. Thus, any desired number of edges of the endcap chip could be formed using the trench formation technique described herein.

After trench formation, a blanket passivation layer 14 (FIG. 2) is formed, for example, by blanket deposition or thermal oxidation. A metal layer 16 (FIG. 3) is then deposited atop passivation layer 14. Note that passivation layer 14 and metal layer 16 conformally reside on the walls of trenches 12. Sputter deposition is one preferred approach to achieving a conformal metal layer. Metal layer 16 can be selected from a wide range of candidate materials, with a preferred metal being that metal to be employed on the side face of the multichip stack within which the endcap chip is to be ultimately incorporated. Currently, this metal is typically aluminum.

In order to protect the metal within the trenches and to prevent entrapping of undesired material/chemicals, the trenches are preferably filled with a material 18 (FIG. 4) which can be subsequently removed. This removable material can be selected from a number of candidate materials, including: polyimide and polyimide-siloxane blends. Measures might be taken to ensure an acceptable release of the fill material from the metal layer. This could include applying a thermally sensitive adhesive layer over the metal layer, which when brought to an elevated temperature degrades, thereby releasing the fill material from the metal layer. At this point, the metal layer 16 is patterned using conventional subtractive etch processing.

Figure 5:
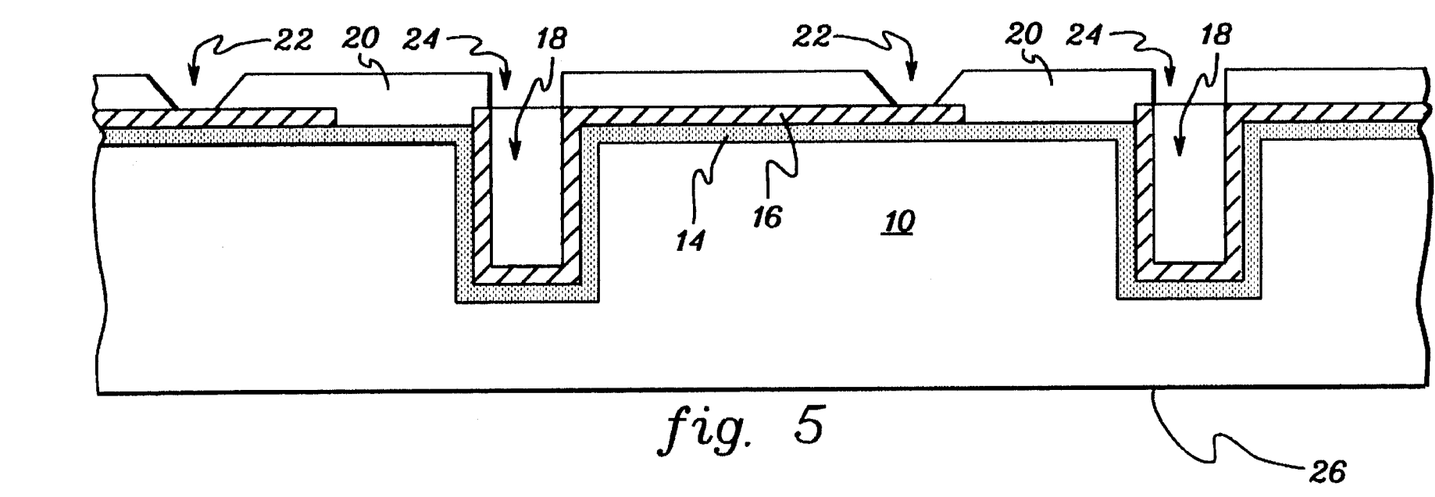
FIG. 5 is a cross-sectional view of the wafer section of FIG. 4 subsequent to blanket deposition and patterning of a passivation layer to expose endcap I/O pads and the trenches.
Figure 6:
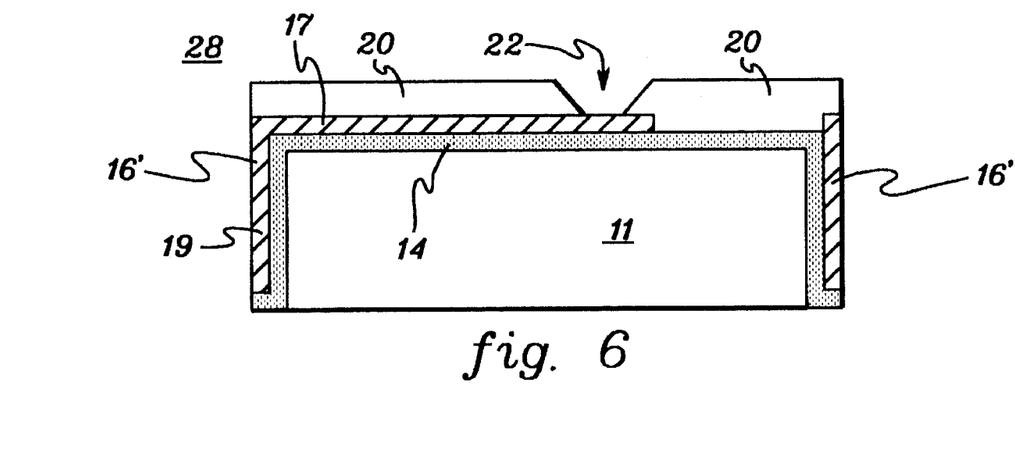
FIG. 6 is a cross-sectional view of an endcap chip formed from the wafer section of FIG. 5 by separating the wafer along the trenches.

Next, a passivation layer 20, such as polyimide, is blanket deposited, and vias 22 and holes 24 are etched to expose the endcap chip's I/O pads and filled trenches, respectively. The endcap chip 28 shown in FIG. 6 is attained by processing the wafer as described in the above-discussed incorporated case. Namely, the lower surface of wafer 10 is chemically, mechanically or chemically/mechanically polished until the substrate is thinned to the trenches. Thereafter, material 18 is removed from the trenches and the endcap chips are separated from the wafer. Note from this discussion that the thickness of the endcap chip is thus roughly equal to the depth of the trenches.

Also, with respect to FIG. 6, note that endcap chip 28 has a conductive, monolithic L-connect 16' with a first leg 17 extending parallel to and partially over an upper surface of the remaining substrate 11 and a second leg 19 extending parallel to and at least partially over an edge surface of substrate 11. Also note that the second leg of the L-connect resides at the edge surface of the endcap chip 28. Presently, endcap chip 28 might be approximately 50–100 micrometers thick from its lower substrate surface to its upper substrate surface. Note that chip 28 has a uniform size since its edges have been photolithographically defined and is therefore ready for direct incorporation into a typical multichip stack fabrication process. The metal portion 16" on the one edge surface of endcap chip 28 might electrically connect via a continuous, horizontally-extending leg (not shown) to a different I/O via on the upper surface of the endcap chip. If not required, then leg 16" could be removed or left in place and electrically isolated.

Figure 7:
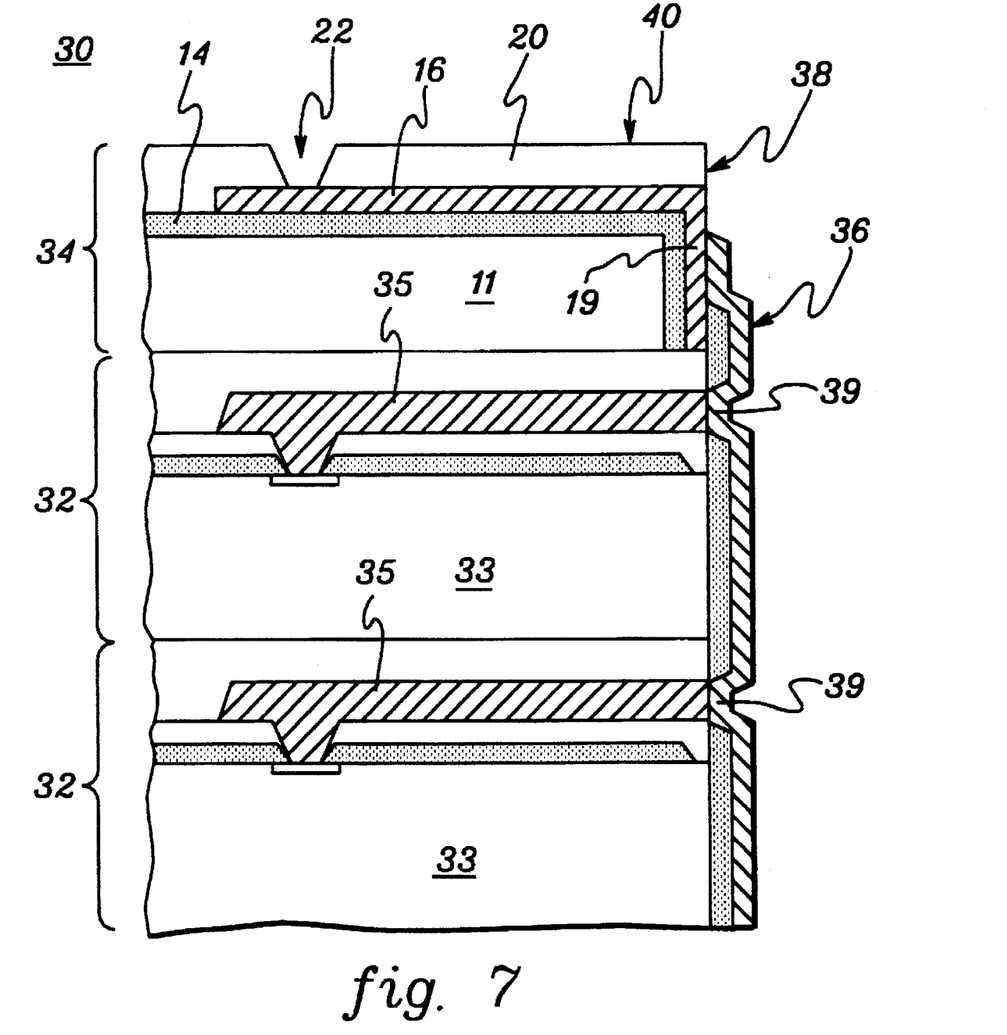
FIG. 7 is a partial cross-sectional view of one embodiment of a multichip stack incorporating an endcap chip in accordance with the present invention.

FIG. 7 presents a multichip stack 30 formed in accordance with the present invention. Stack 30 includes multiple integrated circuit chips 32 and an endcap chip 34. Endcap chip 34 is assumed to have been fabricated as described above in connection with FIGS. 1–6. Integrated circuit chips 32 have representative transfer wirings 35 from active circuitry (not shown) to a common side face 38 of the multichip stack 30. These transfer wire outs to surface 38 are assumed to be formed using conventional processing. At side face 38 standard T-connects 39 are employed to electrically couple the transfer wirings 35 to a side face metallization layer 36. Advantageously, monolithic L-connect 16 of endcap chip 34 directly physically contacts side face metal 36, along a portion of second leg 19 at the edge surface of endcap chip 34 such that the L-connect and the side face metal are integral. Further, monolithic L-connect 16 preferably comprises the same metal as side face metal 36, thereby significantly enhancing the interface characteristic of the two structures. Also, it is significant to note that because L-connect 16 comprises a continuous monolithic structure, there is no discontinuity or interface between the first leg and the second leg.

Figure 8:
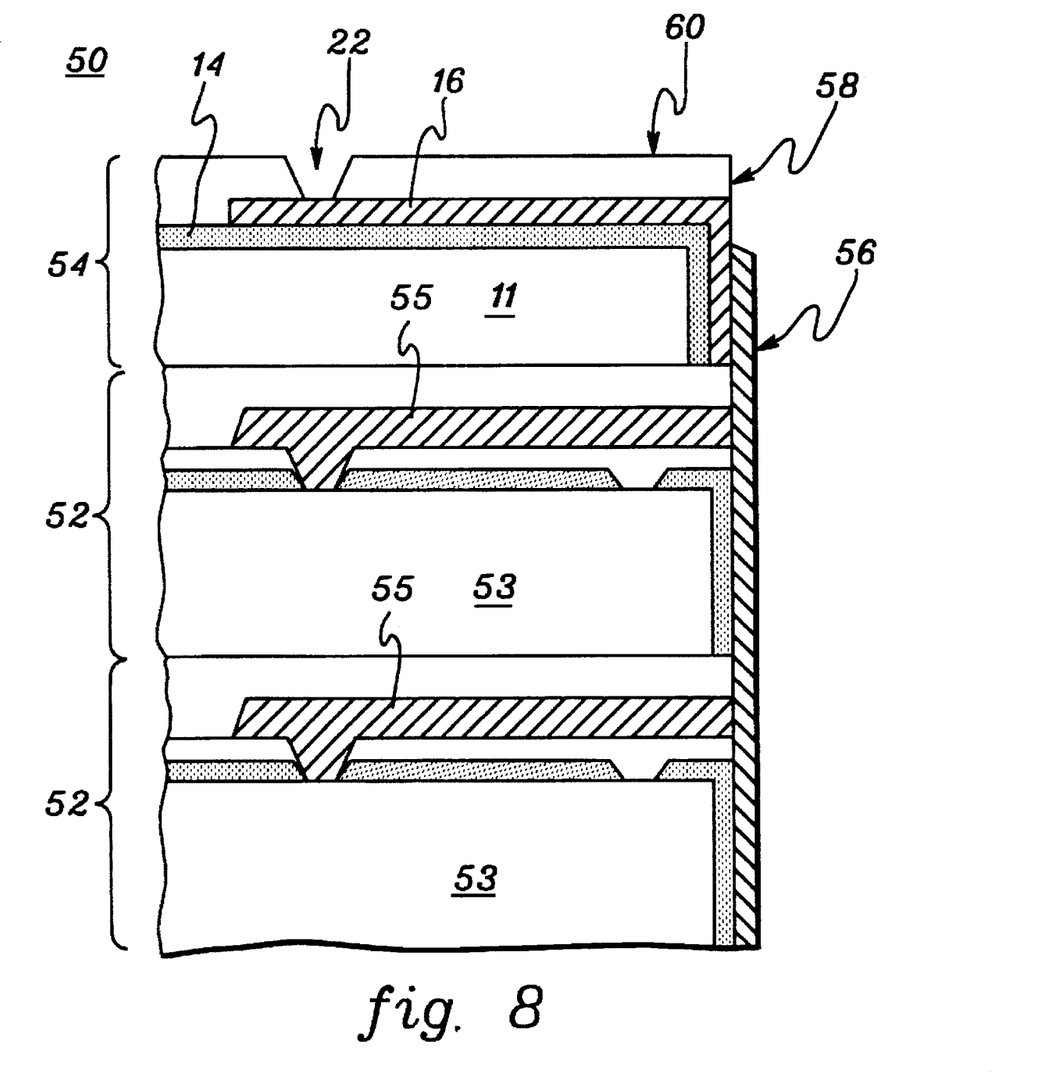
FIG. 8 is a partial cross-sectional view of an alternate embodiment of a multichip stack incorporating an endcap chip in accordance with the present invention.

FIG. 8 depicts an alternative embodiment of a multichip stack 50 in accordance with the present invention. In stack 50, multiple integrated circuit chips 52 are again combined with an endcap chip 54 fabricated as discussed above in connection with FIGS. 1–6. Stack 50 distinguishes from stack 30 of FIG. 7, however, in that integrated circuit chips 52 have also been fabricated as summarized above with reference to the teachings of the incorporated case. Specifically, the integrated circuit chips have an edge surface lithographically defined to exacting tolerances. These edge surfaces are aligned to form side face 58 of multichip stack 50. Because chips 52 are defined to lithographic tolerances, the transfer wire outs 55 from the individual chips are exposed at the edge surface within a minimal tolerance such that side face metallization 56 can also directly physically connect thereto.

Endcap chip 54 is analogous to endcap chip 34 of the multichip stack 30 of FIG. 7. In particular, chip 54 includes a monolithic L-connect 16 disposed to electrically couple an end face metallization (not shown) on end surface 60 of multichip stack 50 to side face metallization 56. Again, there is a direct physical connection between the second leg of monolithic L-connect 16 and the side face metallization 56. Also, the monolithic L-connect is preferably fabricated of the same metal as metallization 56. A significant advantage of stack 50 is that endcap chip 54 can be fabricated of silicon with the same dimensions as integrated circuit chips 52 and to the same exacting tolerances using the approach described herein. Thus, all chips 52 and 54 of the multichip stack will be material of exactly the same size, i.e., within lithographic tolerances.

Figure 9:
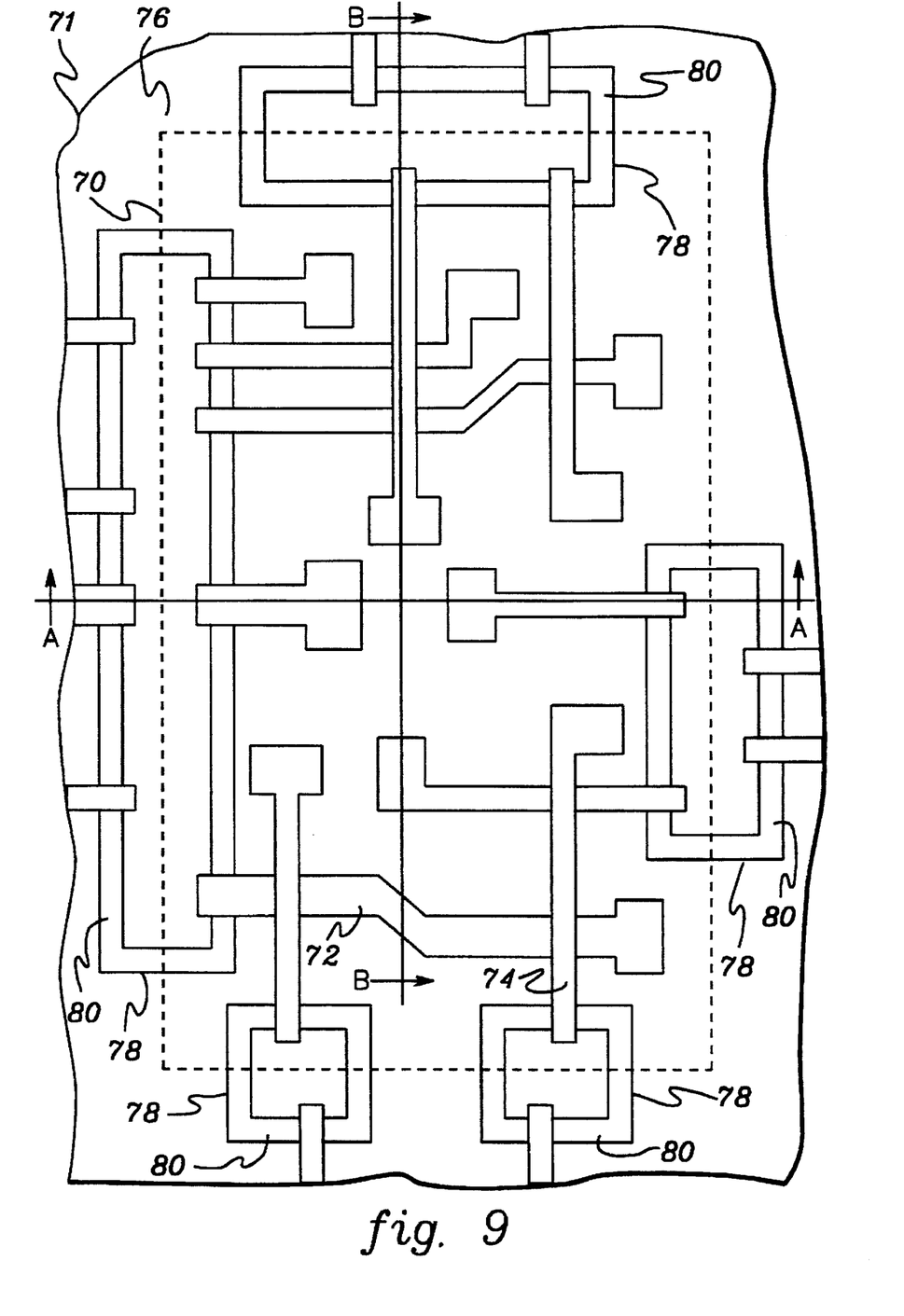
FIG. 9 is a top plan view of a wafer having a first metal level and a second metal level disposed over a defined endcap chip in accordance with the present invention.
Figure 10:
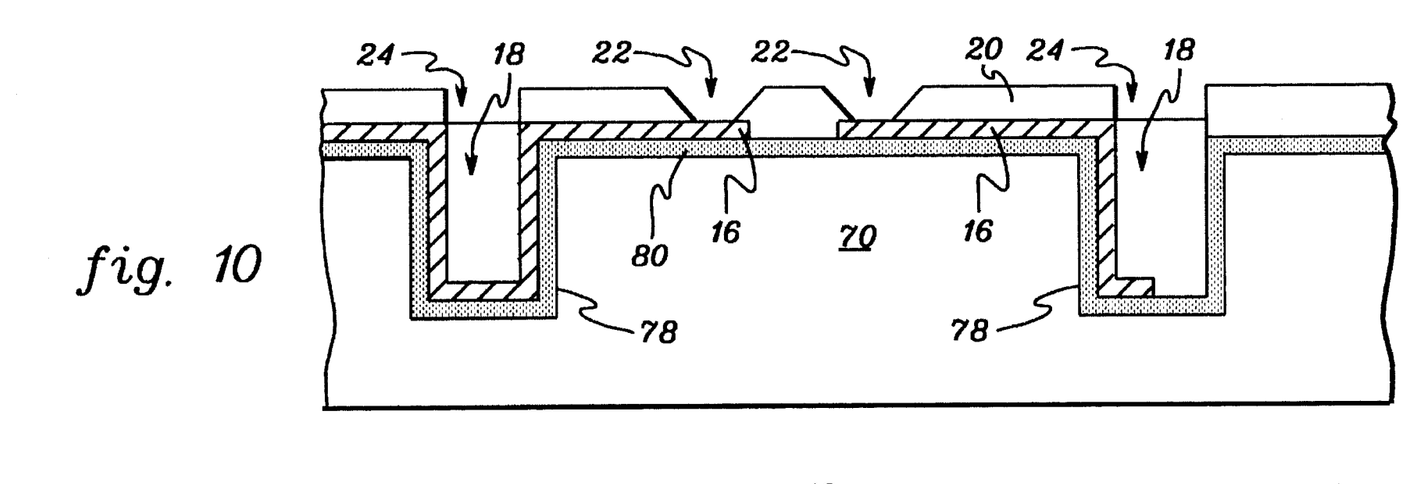
FIG. 10 is a partial cross-sectional view of the wafer of FIG. 9, taken along line A—A.
Figure 11:
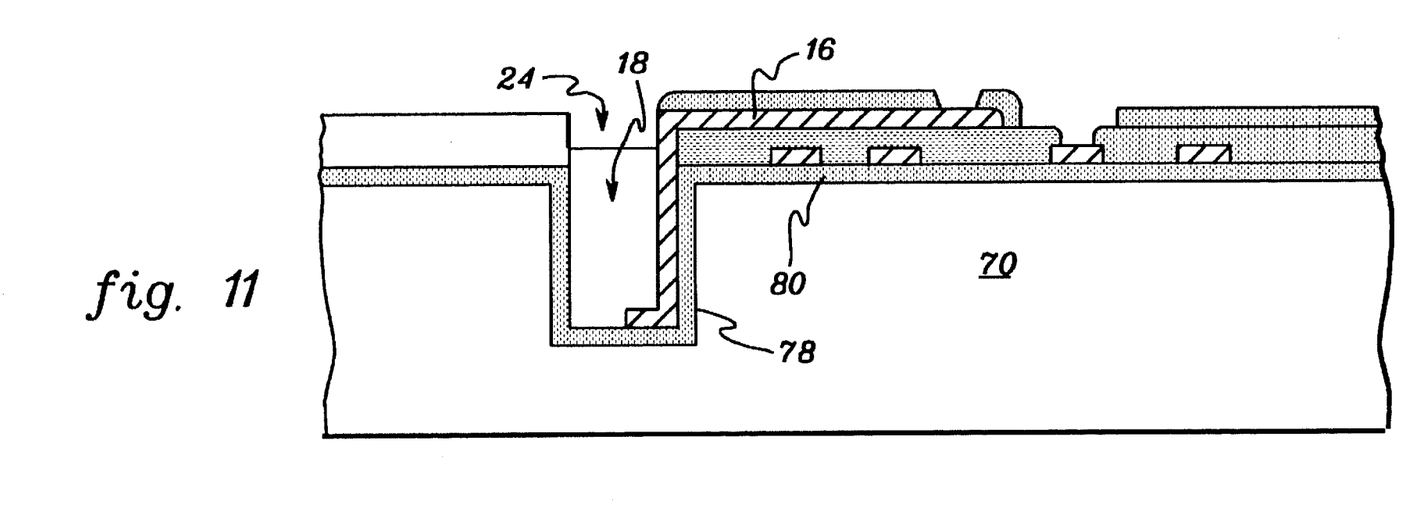
FIG. 11 is a partial cross-sectional view of the wafer of FIG. 9, taken along line B—B.

FIGS. 9–11 present an endcap chip 70 defined within a wafer 71. Chip 70 includes a first metal level 72 and a second metal level 74 disposed above an upper surface 76. Trenches 78 about each of the four sides of endcap chip 70 have been formed in the kerf and filled with a conformal insulator 80, as described above in connection with FIGS. 1–6. Representative cross-sectional views taken along lines A—A and B—B are depicted in FIGS. 10 & 11, respectively. Note with respect to these figures that a conductive, monolithic L-connect in accordance with the present invention can be formed in any metal level above wafer 71. Actual location of the monolithic L-connects will be dictated by the desired side face metallization interconnections once endcap chip 70 has been separated from the wafer and incorporated into a multichip stack.

Figure 12:
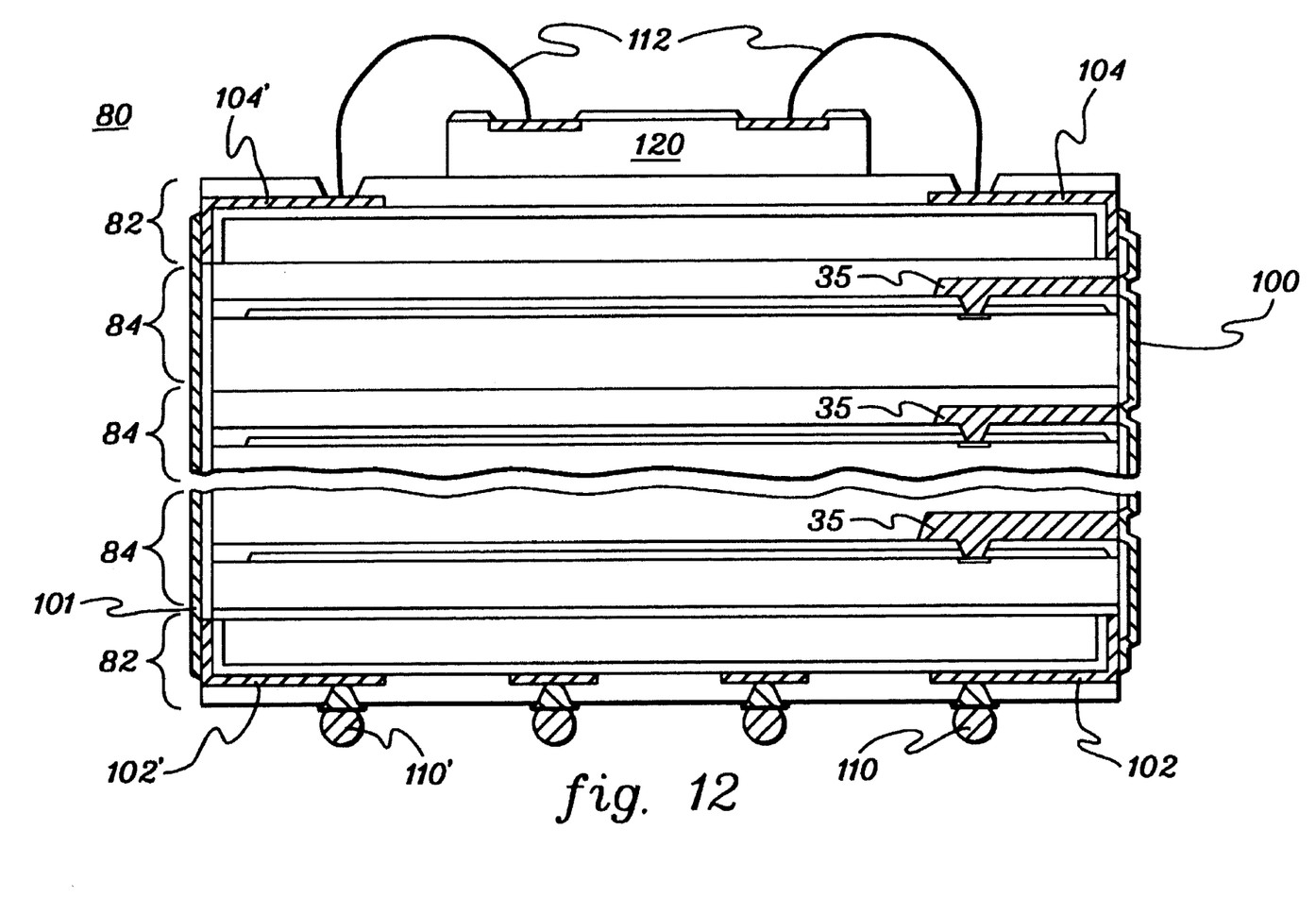
FIG. 12 is a cross-sectional view of another embodiment of a multichip stack incorporating an endcap chip in accordance with the present invention.

FIG. 12 depicts a multichip stack 80 having an endcap chip 82 at each end of the stack of multiple integrated circuit chips 84. Each endcap chip 82, fabricated as described above in connection with FIGS. 1–6, may or may not contain active integrated circuitry. As shown, a side face metallization layer 100 interconnects chip transfer wirings 35 and monolithic L-connects 102 and 104. Again, metallization 100 directly physically contacts the transfer wirings and the monolithic L-connects. A second side face metallization 101 is shown to electrically interconnect monolithic L-connects 102' and 104'.

In this embodiment, monolithic L-connects 102, 102' each electrically couple to a different solder bump 110, 110' on the surface of the lower endcap chip 82. Numerous additional solder bumps 110 may be disposed on this stack surface. These additional solder bumps could be connected to side surface metallizations other than 100, 101 via other conductive, monolithic L-connects, or connected to active circuits, such as protective devices, capacitors or resistors, formed within the lower endcap chip 82 of the stack. In the embodiment shown, solder bumps 110, 110' are electrically connected via side face metallizations 100, 101 to a logic chip 120 residing on an upper stack surface. Wire bond connects 112 electrically interconnect monolithic L-connects 104, 104' to logic chip 120. L-connects 104, 104' may also electrically couple to active circuitry integrated into the upper endcap chip 82 of the stack. Common power supply or ground, or shared timing, address or data lines are examples of the types of functions which can be implemented as shared connections. Finally, while side face metallization 100 is shown coupled to the integrated circuit chips in the stack, and metallization 101 is shown with no such connections, it will be understood by one skilled in the art that a mix of both types of connections are possible on either or both side faces of the multichip stack 80.

To summarize, provided herein is a replacement endcap chip technology which enables the production of thin end caps of extremely uniform size. Preferably, the endcap chips are lithographically defined, and are fabricated of silicon to eliminate any thermal expansion mismatch with the semiconductor chips in a multichip stack into which the endcap chip is to be incorporated, along with the associated reliability issues. If desired, the endcap chips may include regions of active integrated circuitry. Further, identical metals may be used for both the endcap chip wiring and for the side face wiring on the multichip stack. Using the techniques presented, increased multichip stack fabrication throughput and yield are attained, which ultimately decreases fabrication costs.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A carrierless endcap chip a multichip stack, said stack including multiple integrated circuit chips laminated together such that at least one principal surface of each integrated circuit chip contacts a principal surface of an adjacent integrated circuit chip in the multichip stack, said endcap chip comprising:

a substrate of semiconductor material having an upper surface, a lower surface and an edge surface, said edge surface extending in a plane substantially orthogonal to a plane containing said upper surface, and said lower surface contacting a principal surface of an adjacent integrated circuit chip of said stack; and     a conductive, monolithic L-connect integral with the substrate and having a first leg extending at least partially over said upper surface of said substrate and a second leg extending at least partially over said edge surface of said substrate, said second leg having a substantially planar outer surface, wherein when said endcap chip is employed as an end chip within said multichip stack, said conductive, monolithic L-connect electrically interconnects metal on an end face of said multichip stack and metal on a side face of said multichip stack, said side face being parallel to said edge surface of said substrate, and said end face being defined by the upper surface of said substrate.

2. The endcap chip of claim 1, wherein said semiconductor material comprises silicon.

3. The endcap chip of claim 1, wherein said metal on said side face of said multichip stack comprises a first type of metal, and wherein said conductive, monolithic L-connect also comprises said first type of metal.

4. The endcap chip of claim 1, wherein said substrate has a thickness measured from said lower surface to said upper surface of less than 100 μm.

5. The endcap chip of claim 1, wherein said substrate has a rectangular configuration with four edges, said edge surface comprising a first edge of said four edges, and wherein said endcap chip further comprises at least one additional conductive, monolithic L-connect having a first leg extending at least partially over said upper surface of said substrate and a second leg extending at least partially over a second edge of said substrate, said second edge being different from said first edge.

6. The endcap chip of claim 5, wherein said first leg of said conductive, monolithic L-connect and said first leg of said at least one additional conductive, monolithic L-connect comprise different metal levels above said upper surface of said substrate.

7. The endcap chip of claim 1, wherein said endcap chip further comprises an active integrated circuit region supported by said substrate.

8. A multichip stack comprising:

a plurality of integrated circuit chips laminated together such that at least one principal surface of each integrated circuit chip contacts a principal surface of an adjacent integrated circuit chip;

an endcap chip comprised of semiconductor material and having a first principal surface, a second principal surface and an edge surface, said edge surface residing in a plane substantially orthogonal to said first principal surface and said second principal surface, said second principal surface of said endcap chip contacting a principal surface of an end integrated circuit chip of said plurality of integrated circuit chips, said endcap chip further including a conductive, monolithic L-connect integral with said endcap chip and having a first leg extending at least partially over said first principal surface and a second leg extending at least partially over said edge surface, said second leg having a substantially planar outer surface;

a first metallization disposed on a side face formed by said plurality of integrated circuit chips and said endcap chip, and a second metallization disposed over an end face defined by said first principal surface of said endcap chip; and wherein said conductive, monolithic L-connect of said endcap chip electrically connects said first metallization on said side face and said second metallization on said end face of said multichip stack.

9. The multichip stack of claim 8, wherein at least some integrated circuit chips of said plurality of said integrated circuit chips have silicon substrates and said endcap chip has a silicon substrate.

10. The multichip stack of claim 9, wherein said endcap chip includes an active integrated circuit region.

11. The multichip stack of claim 8, wherein said first metallization disposed on said side face comprises a first type of metal and wherein said conductive, monolithic L-connect of said endcap chip also comprises said first type of metal.

12. The multichip stack of claim 8, wherein each chip of said plurality of integrated circuit chips and said endcap chip has a rectangular configuration with four edges, said edge surface of said endcap chip comprising a first edge of said four edges of said endcap chip, and wherein said endcap chip further comprises at least one additional conductive, integral monolithic L-connect having a first leg extending at least partially over said upper surface and a second leg with a substantially planar outer surface extending at least partially over a second edge, said second edge being different from said first edge, and wherein said multichip stack further comprises a third metallization disposed on a second side face such that said at least one additional conductive, monolithic L-connect electrically connects said third metallization on said second side face and said second metallization on said end face of said multichip stack.

13. The multichip stack of claim 12, wherein said first leg of said conductive, monolithic L-connect and said first leg of said at least one additional conductive, monolithic L-connect comprise different metal levels disposed above said first principal surface of said endcap chip.

14. The multichip stack of claim 8, wherein said first metallization directly physically attaches to said second leg of said conductive, monolithic L-connect.

15. The multichip stack of claim 14, wherein at least some integrated circuit chips of said plurality of integrated circuit chips include transfer wirings to said side face, and wherein said first metallization electrically couples to said transfer wirings via standard T-connects.

16. The multichip stack of claim 14, wherein at least some integrated circuit chips of said plurality of integrated circuit chips include transfer wirings to said side face, and wherein said first metallization directly physically attaches to said transfer wirings.

17. The multichip stack of claim 8, wherein each chip of said plurality of integrated circuit chips and said endcap chip is rectangular shaped and has a width defined within lithographic tolerances.

18. The multichip stack of claim 8, wherein each chip of said plurality of integrated circuit chips and said endcap chip has a thickness of less than 100 μm.

19. A carrierless chip of a multichip stack comprising:

a substrate of semiconductor material having an upper surface, a lower surface and an edge surface, said edge surface extending in a plane substantially orthogonal to a plane containing said upper surface, and said lower surface contacting a principal surface of an adjacent integrated circuit chip of said stack; and a conductive, monolithic L-connect integral with the substrate and having a first leg extending at least partially over said upper surface of said substrate and a second leg extending at least partially over said edge surface of said substrate, said second leg having a substantially planar outer surface, wherein when said chip is employed within said multichip stack, said conductive, monolithic L-connect electrically connects to metal on a side face of said multichip stack, said side face being parallel to said edge surface of said substrate.

20. The chip of claim 19 wherein said metal on the side face of said multichip stack comprises a photolithographically defined thin film metal layer.

* * * * *